United States Patent
Atkins et al.

(10) Patent No.: US 9,692,372 B2
(45) Date of Patent: Jun. 27, 2017

(54) AMPLIFIER FOR ELECTROSTATIC TRANSDUCERS

(75) Inventors: Brian Atkins, Monmouth Gwent (GB); Duncan Billson, Warwickshire (GB); David Hoare, Herefordshire (GB)

(73) Assignee: Warwick Audio Technologies Limited, West Midlands (GB)

( * ) Notice: Subject to any disclaimer, the term of this patent is extended or adjusted under 35 U.S.C. 154(b) by 653 days.

(21) Appl. No.: 14/118,751

(22) PCT Filed: May 18, 2012

(86) PCT No.: PCT/GB2012/051132
§ 371 (c)(1),
(2), (4) Date: May 9, 2014

(87) PCT Pub. No.: WO2012/156754
PCT Pub. Date: Nov. 22, 2012

(65) Prior Publication Data
US 2014/0233763 A1 Aug. 21, 2014

(30) Foreign Application Priority Data
May 19, 2011 (GB) .................................. 1108371.4

(51) Int. Cl.
*H03F 3/217* (2006.01)
*H04R 19/02* (2006.01)

(52) U.S. Cl.
CPC .......... *H03F 3/2171* (2013.01); *H03F 3/217* (2013.01); *H04R 19/02* (2013.01); *H03F 2203/21193* (2013.01)

(58) Field of Classification Search
None
See application file for complete search history.

(56) References Cited

U.S. PATENT DOCUMENTS

| | | |
|---|---|---|
| 2,975,243 A | 3/1961 | Katella |
| 3,895,193 A | 7/1975 | Bobb |
| (Continued) | | |

FOREIGN PATENT DOCUMENTS

| | | |
|---|---|---|
| CA | 2195442 | 2/1996 |
| GB | 228 176 | 7/1926 |
| (Continued) | | |

OTHER PUBLICATIONS

International Search Report and Written Opinion prepared by the European Patent Office in International Application Serial No. PCT/GB2012/051130, mailed Nov. 5, 2012.

(Continued)

*Primary Examiner* — Curtis Kuntz
*Assistant Examiner* — Qin Zhu
(74) *Attorney, Agent, or Firm* — McDonnell Boehnen Hulbert & Berghoff LLP

(57) ABSTRACT

A class D audio amplifier provides both an audio output signal and a DC bias voltage to an electrostatic transducer (9). In the amplifier, a modulated sequence of pulses is generated by an input module (1) in response to an input audio signal. The sequence of pulses is amplified by an output module (3) using high speed switching output transistors (4, 5). An output signal is generated by applying a low pass filter (8) to the amplified pulses, and the output signal is provided to the transducer to produce audible output. The amplified sequence of pulses is also used to drive a voltage multiplier module (10) to provide bias voltage for the electrostatic transducer (9). In other embodiments, the bias voltage is provided by a bias voltage module which reverses the bias voltage at intervals, and a phase reverser (13) reverses the phase of the signals fed to the output module (3) simultaneously with reversal of the bias voltage.

17 Claims, 2 Drawing Sheets

(56) References Cited

U.S. PATENT DOCUMENTS

Figure 1:
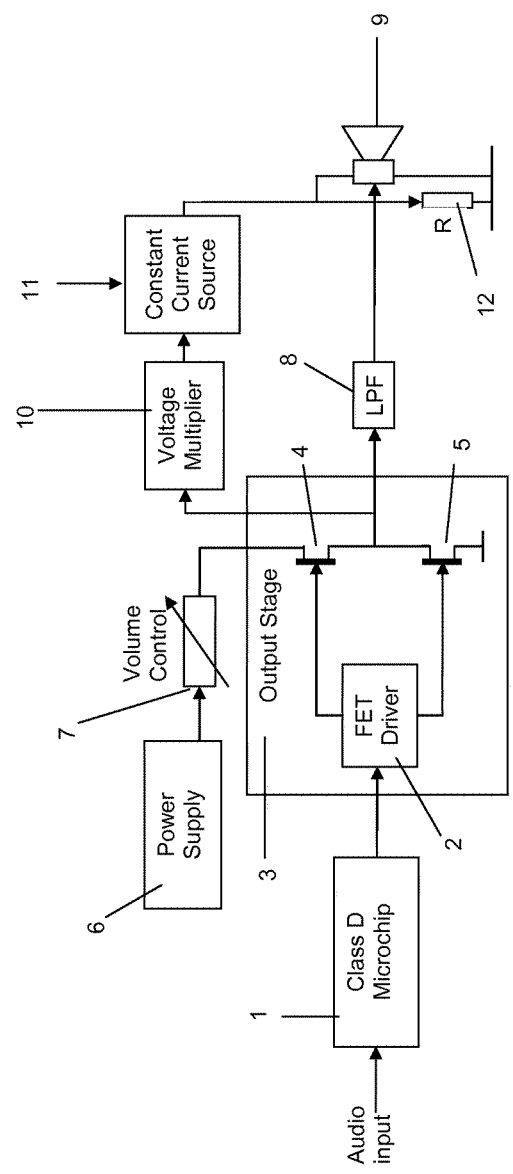

| | | | |
|---|---|---|---|
| 3,935,397 A | 1/1976 | West | |
| 3,992,585 A | 11/1976 | Turner et al. | |
| 4,533,794 A | 8/1985 | Beveridge | |
| 5,161,128 A | 11/1992 | Kenney | |
| 5,471,540 A | 11/1995 | Maeda | |
| 6,628,791 B1 | 9/2003 | Bank et al. | |
| 6,977,549 B2* | 12/2005 | Tsuchi | G09G 3/2011 327/563 |
| 7,076,070 B2 | 7/2006 | Pearce et al. | |
| 8,093,951 B1* | 1/2012 | Zhang | H03F 3/217 330/251 |
| 2002/0141606 A1 | 10/2002 | Schweder et al. | |
| 2006/0208609 A1 | 9/2006 | Heim | |
| 2007/0121970 A1 | 5/2007 | Miyazaki | |
| 2007/0124620 A1 | 5/2007 | Miyazaki | |
| 2007/0189559 A1 | 8/2007 | Haan et al. | |
| 2009/0016552 A1* | 1/2009 | Medley | H04R 19/02 381/191 |
| 2009/0041266 A1 | 2/2009 | Guo et al. | |
| 2009/0412266 | 2/2009 | Guo et al. | |
| 2009/0304212 A1 | 12/2009 | Han et al. | |

FOREIGN PATENT DOCUMENTS

| | | |
|---|---|---|
| GB | 2413027 | 10/2005 |
| JP | 60 046196 | 3/1985 |
| JP | 2009 153056 | 7/2009 |
| WO | WO 93/01691 | 1/1993 |
| WO | WO 98/35529 | 8/1998 |
| WO | WO 02/19764 | 3/2002 |

OTHER PUBLICATIONS

International Search Report and Written Opinion prepared by the European Patent Office in International Application Serial No. PCT/GB2012/051132, mailed Oct. 22, 2012.

Search Report prepared by the Intellectual Property Office in Great Britain Application Serial No. GB1108371.4, dated Sep. 15, 2011.

Search Report prepared by the Intellectual Property Office in Great Britain Application Serial No. GB1108373.0, dated Jun. 9, 2011.

* cited by examiner

AMPLIFIER FOR ELECTROSTATIC TRANSDUCERS

CROSS-REFERENCE TO RELATED APPLICATIONS

This application is a U.S. National Phase Application pursuant to 35 U.S.C. 371 of International Application No. PCT/GB2012/051132, filed on May 18, 2012, which is incorporated by reference in its entirety and published as WO 2012/156754 on Nov. 22, 2012, and which also claims priority to GB 1108371.4, filed on May 19, 2011.

This invention relates to an amplifier for an electrostatic transducer, and more particularly to a Class D amplifier which provides both an alternating signal and a DC bias voltage to an electrostatic transducer such as a loudspeaker.

In a Class D amplifier, an input signal is converted to a sequence of pulses which have a much higher frequency than the maximum frequency of the incoming signals that needs to be amplified. The pulses are modulated, for example using Pulse Width Modulation (PWM) or Pulse Density Modulation (PDM). An output stage comprises high speed switching elements such as MOSFETs or similar devices that are either completely off or completely on. The amplified pulses are then fed to a low pass filter, which removes components such as the pulse frequency and its harmonics, and thus produces an amplified version of the input signal which can be used to drive a transducer such as a loudspeaker.

In the context of an electrostatic loudspeaker, the voltages have to be relatively high. For example the rail voltage for the output stage may be 100 or 200 volts. It is also necessary to provide a DC bias voltage for the electrostatic loudspeaker, which is higher than the output signal voltage. Typically this might be provided by the main power supply which also provides the rail voltage. An object of the present invention is to provide a simple but effective way of generating the bias voltage.

Viewed from one aspect, the invention provides a Class D audio amplifier for use with an electrostatic transducer, comprising an input module for generating a modulated sequence of pulses in response to an input audio signal fed to the input module; an output module for amplifying the sequence of pulses, which includes high speed switching output transistors; a power supply which provides a supply voltage to the switching output transistors; and a low pass filter which receives the amplified sequence of pulses and generates an output signal for the transducer; wherein the amplified sequence of pulses from the output module is fed to a voltage multiplier module which provides a constant bias voltage for the electrostatic transducer.

Thus, the pulses used to generate the audio output signals for the transducer, are also used to drive the voltage multiplier to provide the bias voltage for the transducer.

In an arrangement with a conventional volume control for the amplifier, which attenuates the input signal, the supply voltage will remain constant, and so will the modulated pulse levels and thus the bias voltage. However, in a preferred embodiment the volume control is provided by varying the supply voltage for the switching transistors. By reducing the supply voltage, the modulated pulse levels are reduced, and thus the volume. Since this will affect the driving of the voltage multiplier, this is arranged to boost the bias voltage to an appropriate level when the system is running at low volume. This means that at maximum volume, the output of the voltage multiplier will be much higher than is needed. Accordingly, in this type of arrangement the voltage multiplier module incorporates a unit for generating a constant voltage from the output of the voltage multiplier. Typically this could be a constant current unit supplying a constant current through a resistance so that the voltage generated across the resistance remains constant and can be used as the bias voltage.

The voltage multiplier may be a conventional type of unit, and typically a network of diodes and capacitors such as a Cockcroft Walton multiplier.

Preferably the switching output transistors of the output stage are arranged in a source follower configuration, with the incoming pulses being fed to the gate terminals of the transistors. This avoids the need for a feedback path, which would cause problems as the gain would have to be modified to compensate for the change in supply voltage in arrangements where volume control is provided by varying the output form the power supply.

The transducer could be incorporated in an earphone or headphones. In one embodiment the transducer is in the form of an electrostatic loudspeaker.

The electrostatic transducer may be of a type with polymer films. For example, there could be a first layer made of an insulating polymer which has been provided with a conductive layer on its upper surface. Over this layer is a flexible layer of an insulating polymer film, and over that is a conductive layer. The conductive layer and the insulating layer could be separate layers or the conductive layer could be in the form of metallisation applied to the outer surface of the insulating layer.

It has been found that in such an arrangement, polarization of the polymer film or films between the conductive electrode layers may occur. This can cause unwanted effects such as a reduction in sound intensity and an increase in sound distortion.

Accordingly, in a preferred embodiment of the present invention, the bias voltage is reversed periodically, thus reversing the polarisation. Preferably, to maintain phase integrity when used with, for example, a bass driver or a transducer of another channel, the phase of the signal is reversed simultaneously. This may be done by means of a phase reverser between the input module and the output module which changes the phase of the modulated signal.

Reversing the bias voltage can be achieved by a pair of changeover switches, each of which can be switched between two modes. In the first mode the switch is connected to the bias voltage, and in the second mode the switch is connected to ground. When one switch is the in first mode, the other switch is in the second mode. The switches may be of any type but preferably operate in a "break before make" mode. The switches may be in the form of relays. A control signal operates the switches and also controls the phase reverser. The control signal is used periodically to reverse the bias voltage. In preferred embodiments, this can be done whilst a transducer is playing.

This feature of bias voltage reversal is inventive in its own right and thus viewed from another aspect of the invention there is provided a Class D audio amplifier for use with an electrostatic transducer, comprising an input module for generating a modulated sequence of pulses in response to an input audio signal fed to the input module; an output module for amplifying the sequence of pulses, which includes high speed switching output transistors; a power supply which provides a supply voltage to the switching output transistors; and a low pass filter which receives the amplified sequence of pulses and generates an output signal for the transducer; wherein a bias voltage module is provided to supply a constant bias voltage for the electrostatic transducer; and wherein the bias voltage module is arranged to reverse the bias voltage at intervals on receipt of a control signal, and a phase reverser is positioned between the input module and the output module, the phase reverser being responsive to the control signal to reverse the phase of the signals fed to the output module, simultaneously with reversal of the bias voltage; there being a control module to provide the control signals to the bias control module and the phase reverser.

The bias module may include a voltage multiplier module which provides a constant bias voltage for the electrostatic transducer, the voltage multiplier module receiving the amplified sequence of pulses from the output module as in accordance with the first aspect of the invention.

Figure 2:
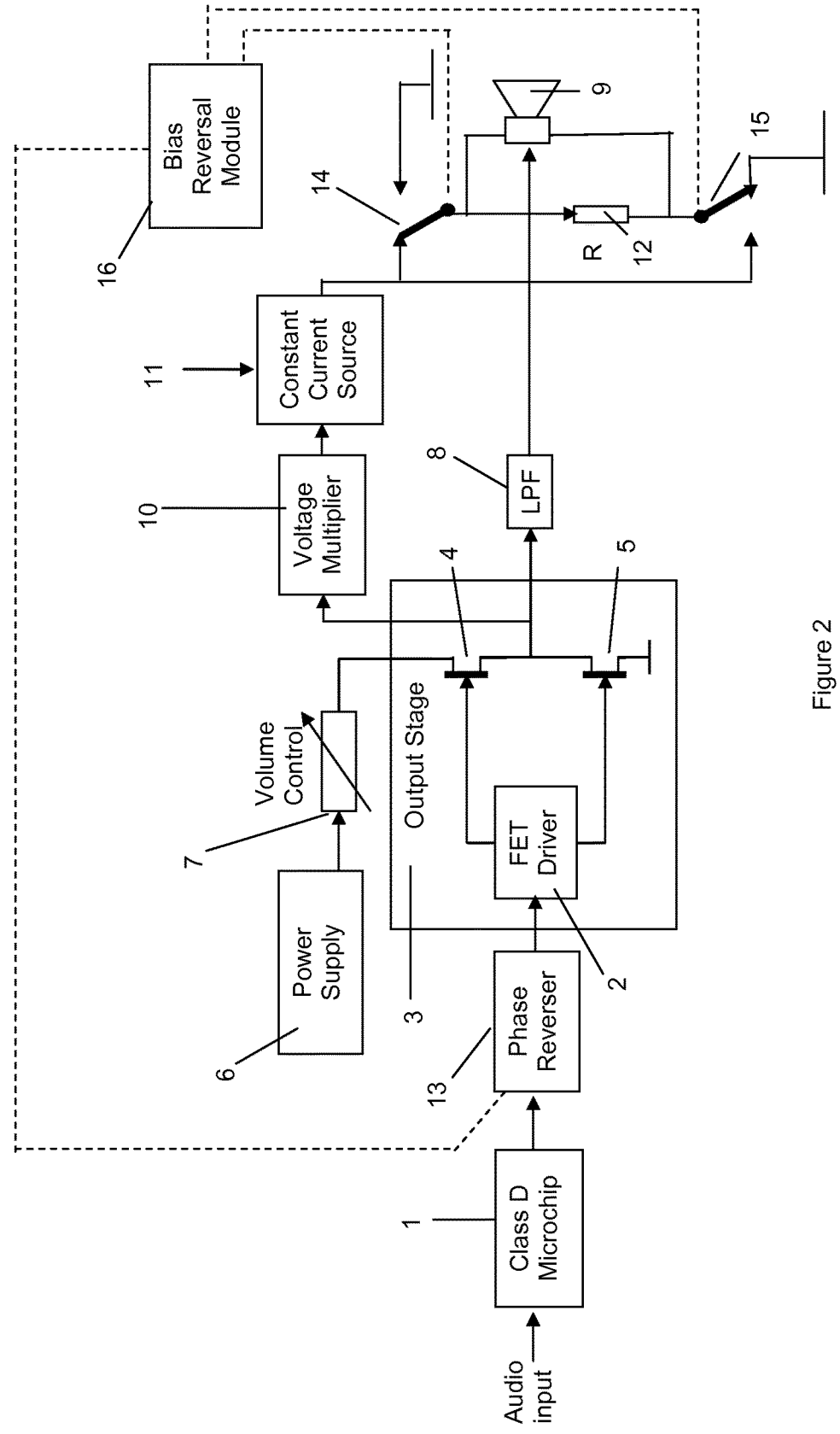

Some embodiments of the invention will now be described by way of example and with reference to the accompanying drawings, in which:

FIG. 1 is a schematic diagram of an arrangement of a first embodiment of the invention; and FIG. 2 is a schematic diagram of an arrangement of a second embodiment of the invention, which incorporates bias voltage reversal.

In the embodiment of FIG. 1, an audio input signal is fed to a commercially available Class D amplifier microchip 1. This may use, for example, pulse-width modulation (PWM), pulse density modulation (sometimes referred to as pulse frequency modulation), sliding mode control (more commonly called "self-oscillating modulation") or discrete-time forms of modulation such as delta-sigma modulation. In a preferred embodiment PWM is used. This may be obtained by using a high speed comparator that compares a high frequency triangular wave with the audio input. This generates a series of pulses of which the length of the duty cycle is directly proportional to the instantaneous value of the audio signal. The output from the comparator is fed to an FET driver module 2, which in this case is incorporated in an output stage 3. The output stage includes a pair of MOSFETs 4,5 (Metal Oxide Semiconductor Field Effect transistors), although in practice these may not utilise metal oxide and they may be more appropriately named IGFETs (Insulated Gate FETs) or MISFETs (Metal-Insulator-Semiconductor FETs). These transistors are arranged in a source follower configuration, with the outputs from the FET driver module being fed to the gates.

Power is supplied to the transistors 4,5 of the output stage 3 from a power supply 6 which can supply a voltage of, say, 200 V. The output from the power supply is fed to a potentiometer or the like 7, which can reduce the voltage from the maximum. This has the effect of reducing the output volume. The potentiometer could be incorporated as an integral part of the power supply.

The output from the transistors 4,5 is fed to a low pass filter 8 which generates the audio signal to be fed to electrostatic loudspeaker 9.

The output from the transistors 4, 5—before the low pass filter 8—is also fed to a voltage multiplier 10, which in this embodiment is a Cockcroft Walton multiplier. This increases the maximum voltage from the power supply to, say, 400 volts. The rectified boosted voltage is fed to constant current source 11. The output from this is fed to a resistor 12. The resulting constant voltage across the resistor 12 is used as the bias voltage for loudspeaker 9.

The amplifier may be used with an electrostatic loudspeaker such as that disclosed in WO 2007/077438. The invention is particularly suitable for use with an electrostatic loudspeaker having an electrically conductive first layer, a flexible insulating second layer disposed over the first layer, and a flexible electrically conductive third layer disposed over the second layer, with the signal and the bias voltage being applied across the first and third layers. The third layer may be in the form of a conductive coating on the second layer, on the side remote from the first layer. The first layer may be provided with an array of apertures.

With reference now to FIG. 2, there shown a modification of the above construction, which reverses the bias voltage periodically and simultaneously reverses the phase of the signals to the output stage. A phase reverser 13 is provided between the class D amplifier microchip 1 and the FET Driver 2, to reverse the phase of the signals provided to the FET driver 2. The constant current source 11 is connected to a pair of switches 14 and 15. These are in the form of relays which operate in a break before make mode. Switch 14 can be operated so that one side of the resistor 12 is connected either to the constant current source 11 or to ground. When that one side of the resistor 12 is connected to the constant current source, switch 15 connects the other side of the resistor 12 to ground. This is the position shown in FIG. 2. A When the bias polarity is to be reversed, a bias reversal module 16 sends a control signal to phase reverser 13, switch 14 and switch 15. Simultaneously, the switch 14 connects the one side of the resistor 12 to ground, switch 15 connects the other side of the resistor 12 to the constant current source 11, and phase reverser 13 reverses the phase of the signals sent to the FET driver. When the polarity is to be reversed again, bias reversal module 16 sends another control signal to phase reverser 13, switch 14 and switch 15. Simultaneously, the switch 14 connects the one side of the resistor 12 to the constant current source 11, switch 15 connects the other side of the resistor 12 to ground, and phase reverser 13 reverses the phase of the signals sent to the FET driver. The bias reversal module issues control signals at periodic intervals, so that the polarity of the bias voltage is changed at periodic intervals. This can be done whilst the amplifier is operational and the transducer 9 is playing sounds.

The invention claimed is:

1. A Class D audio amplifier for use with an electrostatic transducer, comprising an input module for generating a modulated sequence of pulses in response to an input audio signal fed to the input module; an output module for amplifying the sequence of pulses, which includes high speed switching output transistors; a power supply which provides a supply voltage to the switching output transistors; and a low pass filter which receives the amplified sequence of pulses and generates an output signal for the transducer; wherein the amplified sequence of pulses from the output module is fed to a voltage multiplier module which provides a constant bias voltage for the electrostatic transducer.

2. The amplifier of claim 1, wherein volume control is provided by varying the supply voltage for the switching output transistors.

3. The amplifier of claim 1, wherein the voltage multiplier module incorporates a constant voltage generator connected to the output of the voltage multiplier.

4. The amplifier of claim 3, wherein the output from the voltage multiplier is fed to a constant current unit driving a resistance so that a voltage across the resistance remains constant and can be used as the bias voltage.

5. The amplifier of claim 3, wherein the voltage multiplier is a Cockcroft Walton multiplier.

6. The amplifier of claim 1, wherein the switching output transistors of the output module are arranged in a source follower configuration, the transistors having gate terminals, with the sequence of pulses being fed to the gate terminals of the transistors.

7. The amplifier of claim 1, further configured to reverse the bias voltage periodically.

8. The amplifier of claim 7, further configured to reverse a phase of a modulated signal comprising the modulated sequence of pulses passed to the output module, simultaneously with reversal of the bias voltage.

9. The amplifier of claim 8, wherein a phase reverser is provided between the input module and the output module to change the phase of the modulated signal fed to the output module.

10. The amplifier of claim 7, wherein reversal of the bias voltage is effected by a pair of changeover switches, each switch of said pair of switches can be switched between a first mode in which the switch is connected to the bias voltage, and a second mode in which the switch is connected to ground, the arrangement being such that when one switch of said pair of switches is in the first mode, the other switch of said pair of switches is in the second mode.

11. The amplifier of claim 10, wherein one switch is connected to one side of a resistor and the other switch is connected to the other side of the resistor, the bias voltage being the voltage produced across the resistor.

12. A system comprising:
a Class D audio amplifier for use with an electrostatic transducer, comprising an input module for generating a modulated sequence of pulses in response to an input audio signal fed to the input module; an output module for amplifying the sequence of pulses, which includes high speed switching output transistors; a power supply which provides a supply voltage to the switching output transistors; and a low pass filter which receives the amplified sequence of pulses and generates an output signal for the transducer; wherein the amplified sequence of pulses from the output module is fed to a voltage multiplier module which provides a constant bias voltage for the electrostatic transducer; and
the electrostatic transducer.

13. The system of claim 12, wherein the electrostatic transducer is an electrostatic loudspeaker.

14. The system of claim 12, wherein the electrostatic transducer has an electrically conductive first layer, a flexible insulating second layer disposed over the first layer, and a flexible electrically conductive third layer disposed over the second layer, with the signal and the bias voltage being applied across the first and third layers.

15. The system of claim 14, wherein the third layer is in the form of a conductive coating on the second layer, on a side of the second layer remote from the first layer.

16. The system of claim 14, wherein the first layer is provided with an array of apertures.

17. A Class D audio amplifier for use with an electrostatic transducer, comprising an input module for generating a modulated sequence of pulses in response to an input audio signal fed to the input module; an output module for amplifying the sequence of pulses, which includes high speed switching output transistors; a power supply which provides a supply voltage to the switching output transistors; and a low pass filter which receives the amplified sequence of pulses and generates an output signal for the transducer; wherein a bias voltage module is provided to supply a constant bias voltage for the electrostatic transducer; and wherein the bias voltage module is arranged to reverse the bias voltage at intervals on receipt of a control signal, and a phase reverser is positioned between the input module and the output module, the phase reverser being responsive to the control signal to reverse a phase of the signals fed to the output module, simultaneously with reversal of the bias voltage; there being a control module to provide the control signal to the bias control module and the phase reverser.

* * * * *